United States Patent
Huang et al.

(10) Patent No.: US 10,439,135 B2
(45) Date of Patent: Oct. 8, 2019

(54) VIA STRUCTURE AND METHODS OF FORMING THE SAME

(71) Applicant: Taiwan Semiconductor Manufacturing Co., Ltd., Hsinchu (TW)

(72) Inventors: Wei-Chieh Huang, Hsinchu County (TW); Jieh-Jang Chen, Hsinchu County (TW); Feng-Jia Shiu, Hsinchu County (TW); Chern-Yow Hsu, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/884,505

(22) Filed: Jan. 31, 2018

(65) Prior Publication Data

US 2019/0140173 A1    May 9, 2019

Related U.S. Application Data

(60) Provisional application No. 62/583,866, filed on Nov. 9, 2017.

(51) Int. Cl.
*H01L 21/768* (2006.01)
*H01L 45/00* (2006.01)
(Continued)

(52) U.S. Cl.
CPC .... *H01L 45/1273* (2013.01); *H01L 21/28562* (2013.01); *H01L 21/28568* (2013.01); *H01L 21/31053* (2013.01); *H01L 21/31144* (2013.01); *H01L 21/3212* (2013.01); *H01L 21/76879* (2013.01); *H01L 45/06* (2013.01); *H01L 45/1233* (2013.01); *H01L 45/144* (2013.01);
(Continued)

(58) Field of Classification Search
CPC ............... H01L 45/06; H01L 21/76879; H01L 21/3212; H01L 21/31144
See application file for complete search history.

(56) References Cited

U.S. PATENT DOCUMENTS 8,772,109 B2    7/2014  Colinge
8,785,285 B2    7/2014  Tsai et al.
(Continued)

FOREIGN PATENT DOCUMENTS

JP    2007149900    6/2007

*Primary Examiner* — Hoang-Quan T Ho
*Assistant Examiner* — Khatib A Rahman
(74) *Attorney, Agent, or Firm* — Haynes and Boone, LLP

(57) ABSTRACT

A method includes providing a substrate having a conductive column, a dielectric layer over the conductive column, and a plurality of sacrificial blocks over the dielectric layer, the plurality of sacrificial blocks surrounding the conductive column from a top view; depositing a sacrificial layer covering the plurality of sacrificial blocks, the sacrificial layer having a dip directly above the conductive column; depositing a hard mask layer over the sacrificial layer; removing a portion of the hard mask layer from a bottom of the dip; etching the bottom of the dip using the hard mask layer as an etching mask, thereby exposing a top surface of the conductive column; and forming a conductive material inside the dip, the conductive material being in physical contact with the top surface of the conductive column.

20 Claims, 16 Drawing Sheets

(51) Int. Cl.
    *H01L 21/321* (2006.01)
    *H01L 21/311* (2006.01)
    *H01L 21/285* (2006.01)
    *H01L 21/3105* (2006.01)

(52) U.S. Cl.
    CPC ........ *H01L 45/146* (2013.01); *H01L 45/1608* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,564,585 B1 | 2/2017 | Lille et al. |
| 9,576,814 B2 | 2/2017 | Wu et al. |
| 2005/0127347 A1* | 6/2005 | Choi ................. H01L 21/76816 257/2 |
| 2007/0281420 A1 | 12/2007 | Lai et al. |
| 2013/0157449 A1 | 6/2013 | Cao et al. |

* cited by examiner

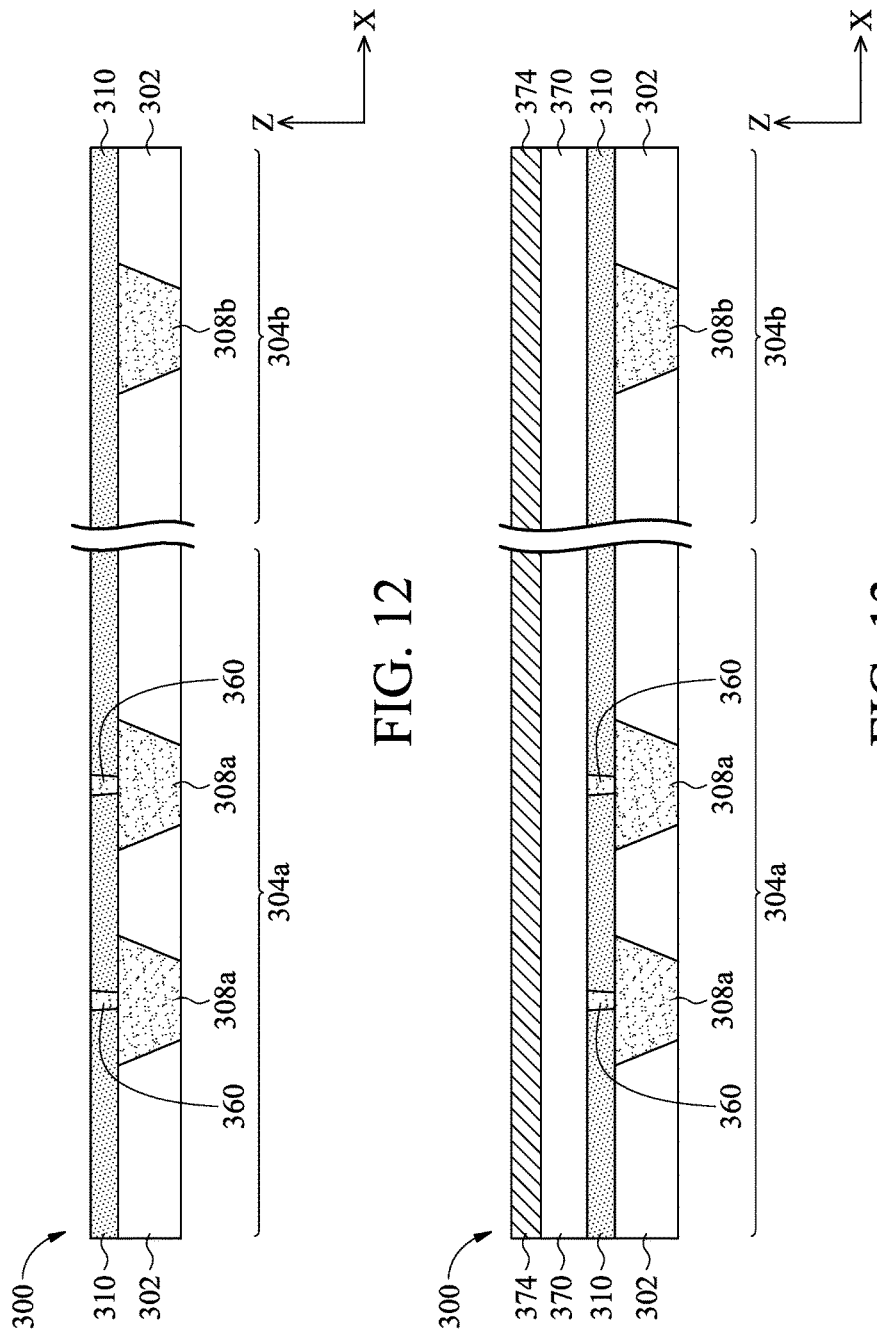

US 10,439,135 B2

VIA STRUCTURE AND METHODS OF FORMING THE SAME

PRIORITY DATA

This application claims priority to U.S. Provisional Patent Application Ser. No. 62/583,866 entitled "VIA Structure and Methods of Forming the Same," and filed Nov. 9, 2017, the entire disclosure of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, phase-change memory operates under the passage of an electric current through a heating element for quickly heating and quenching the phase-change material into amorphous or crystalline states, and it is generally desired to fabricate as small as possible the heating element. A compact heating element, such as a via made by titanium nitride (TiN) in physical contact with the phase-change material in some embodiments, helps to reduce phase-change memory's form factor due to its smaller size, and also increases phase-change memory's speed due to its higher heating efficiency. However, as semiconductor technology progresses to smaller geometries, not limited to phase-change memory, the traditional photoresist approach for via patterning is restrained by resolution and ingredients of photoresist component, which may suffer from photoresist scum and poor critical dimension uniformity (CDU) issues. Therefore, although existing approaches in via formation have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3, 4, 5A, 5B, 5C, 5D, 6, 7, 8, 9, 10, 11, 12, 13, 14, and 15 are cross-sectional views of a semiconductor device with PCRAM cells constructed according to the method in FIGS. 2A and 2B, in accordance with some embodiments.

DETAILED DESCRIPTION

Figure 1:
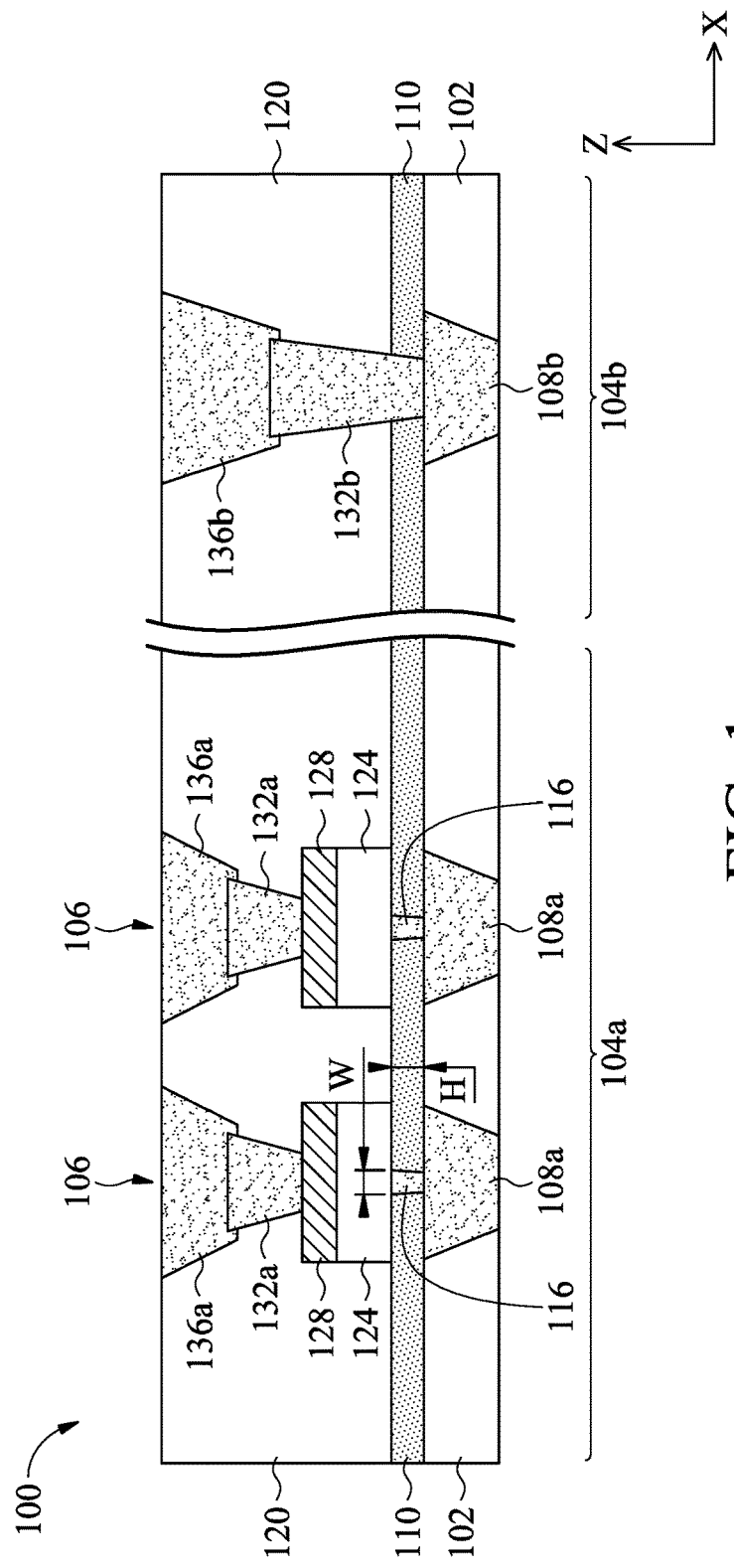
FIG. 1 is a cross-sectional view of a semiconductor device with phase-change random access memory (PCRAM) cells, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to via structures in semiconductor devices and methods of forming the same. More particularly, the present disclosure is related to providing methods and structures of bottom via as a heating element in a phase-change memory cell. Phase-change memory is also known as phase-change random access memory (PCRAM), which is a type of non-volatile memory in which phase-change material, such as chalcogenide semiconductors in some embodiments, is used for storing states. The state of a function area in the phase-change material is switched between crystalline and amorphous, for example, by a current flow through a heating element that generates heat. In the crystalline state, the phase-change material has a low resistivity, while in the amorphous state it has a high resistivity. The phase-change material is stable at certain temperature ranges in both crystalline and amorphous states and can be switched back and forth between the two states by heat excitations. The resistivity ratios of the phase-change material in the amorphous and crystalline states are typically greater than 1000, and the state of the function area is then used to represent the stored data. For example, after a heat excitation if the function area is in the crystalline state, the stored data is a low logic level (e.g., a Low). But if the function area is in the amorphous state, the stored data is a high logic level (e.g., a High). PCRAM has several operating and engineering advantages, including high speed, low power, non-volatility, high density, and low cost. For example, PCRAM devices are non-volatile and may be written into rapidly, for example, within less than about 50 nanoseconds. The PCRAM cells may have a high density and are compatible with CMOS logic and can generally be produced at lower costs than other types of memory cells.

FIG. 1 illustrates a cross-sectional view of a semiconductor device 100 with PCRAM cells in accordance with an embodiment. The semiconductor device 100 includes a substrate 102 (partly shown in FIG. 1). The substrate 102 may be a semiconductor substrate formed of semiconductor materials such as silicon, silicon germanium, gallium arsenide, and the like, and may be a bulk substrate or a semiconductor-on-insulator substrate. The semiconductor device 100 includes a PCRAM region 104a, in which one or more PCRAM cells 106 are to be formed, and a peripheral region 104b, which may be a logic circuit region including, but not limited to, the control circuit of the PCRAM cells.

The substrate 102 includes one or more conductive columns 108a and 108b. The conductive columns 108a and 108b may be formed of tungsten (W), aluminum (Al), copper (Cu), AlCu, and/or other suitable conductive materials. The formation of the conductive columns 108a and 108b may include a single damascene process or a dual damascene process. In yet one embodiment, the conductive columns 108a and 108b are made of polysilicon and/or other suitable materials. In some embodiments, the conductive columns 108a and 108b are contact plugs formed in an inter-layer dielectric (ILD) layer for accessing source/drain regions and/or gate electrodes of transistors (not shown) formed in lower layers of the substrate 102. In PCRAM region 104a, the conductive columns 108a are also referred to as bottom electrodes 108a of the PCRAM cells 106.

In PCRAM region 104a, vias 116 are electrically connected to the bottom electrodes 108a, and are surrounded by a first dielectric layer 110. In some embodiments, the first dielectric layer 110 is formed of silicon carbide (SiC), silicon nitride (Si3N4), and/or other suitable materials. In some embodiments, the vias 116 are formed of titanium nitride (TiN), tungsten (W), tantalum nitride (TaN), and/or other suitable materials. The vias 116 are also referred to as bottom vias 116 of the PCRAM cells 106, as they are stacked under the phase-change strips 124. The vias 116 may also be referred to as heating elements 116 of the PCRAM cells 106, as heat generated by the vias 116 when current follows there-through will cause the state of the phase-change strips 124 to change. The phase-change strips 124 are electrically connected to the bottom vias 116. The phase-change strips 124 include phase-change materials, such as chalcogenide materials and/or stoichiometric materials. In some embodiments, the phase-change strips 124 include, but not limited to, germanium (Ge), Tellurium (Te), and Antimony (Sb). In one specific example, the phase-change strips 124 include GeSbTe alloy, AgInSbTe alloy, or hafnium oxide compound.

In PCRAM region 104a, top electrodes 128 are stacked above and electrically coupled to the phase-change strips 124. In some embodiments, the top electrodes 128 are formed of TiN, TaN, and/or other suitable materials. The phase-change strips 124 and the top electrodes 128 may be surrounded by a second dielectric layer 120. The second dielectric layer 120 may be an ILD layer or an inter-metal dielectric (IMD) layer. In some embodiments, the dielectric layers 110 and 120 include different material compositions. In some embodiments, the dielectric layers 110 and 120 include the same material (e.g., Si3N4), such that there is no boundary between the dielectric layers 110 and 120 in areas that they are in contact with each other.

In some embodiments, the PCRAM cells 106 further include vias 132a and metal lines 136a surrounded by the second dielectric layer 120, which electrically connect the top electrodes 128 to upper metal layers (not shown) and/or other metal interconnections. The vias 132a and metal lines 136a may be formed of Al, Cu, AlCu, W, and/or other suitable conductive materials. The formation of the vias 132a and metals lines 136a may include dual damascene process. Similarly, in peripheral region 104b, vias 132b and metal lines 136b electrically connect to the conductive column 108b through the first dielectric layer 110.

Inside a PCRAM cell 106, when current flows through a bottom via 116 and a phase-change strip 124, adequate heat may be generated in the bottom via 116 due to its high resistivity, causing the phase-change strip 124 to change states. The heat efficiency of the bottom via 116 is one of major factors affecting a PCRAM cell's writing speed. A bottom via structure with low width-to-height ratio may exhibit higher resistivity than one with high width-to-height ratio. In some embodiments, the bottom via 116 has a width-to-height ratio (W/H as denoted in FIG. 1) less than 1.0. In furtherance of some embodiments, the bottom via 116 has a width-to-height ratio ranging from about 0.2 to about 1.0. In one specific example, the bottom via 116 has a width-to-height ratio about 0.4. In yet another embodiment, the bottom via 116 has a width-to-height ratio ranging from about 0.1 to about 0.2. The height of the bottom via 116 may be within a range from about 20 nm to about 100 nm, such as about 50 nm.

Figure 2A:
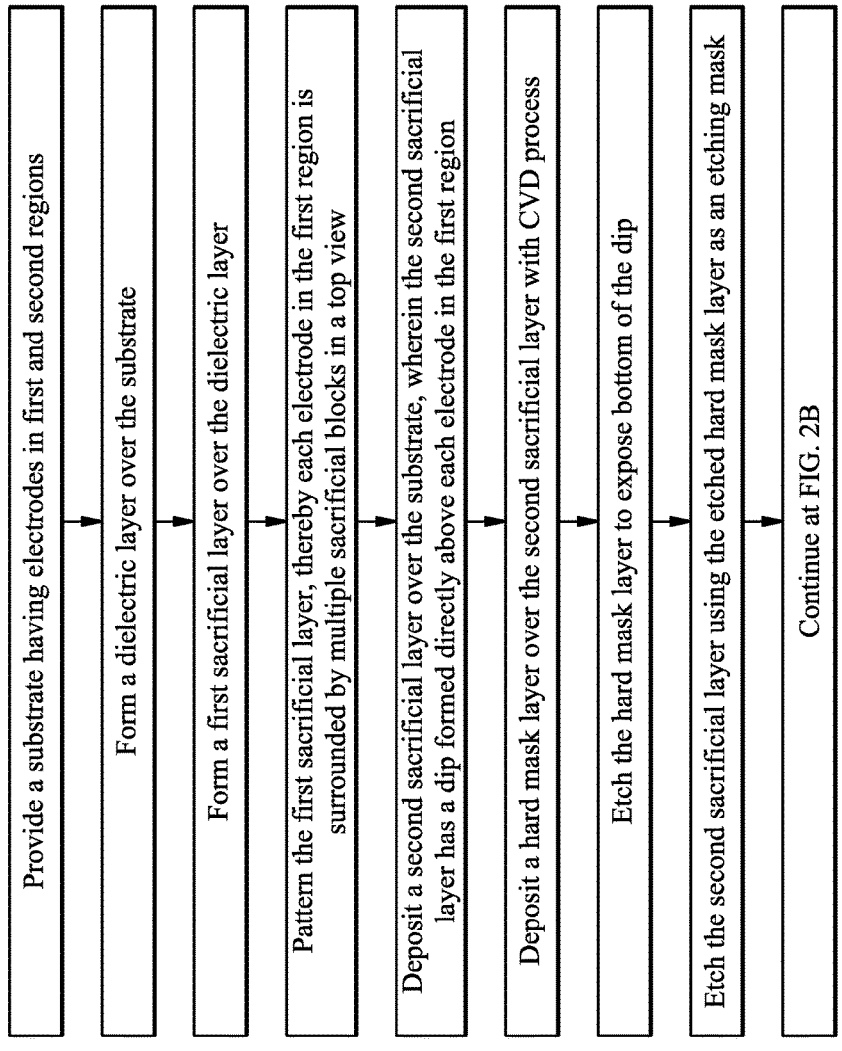
FIGS. 2A and 2B show a flow chart of a method of forming a semiconductor device with PCRAM cells according to various aspects of the present disclosure.
Figure 2B:
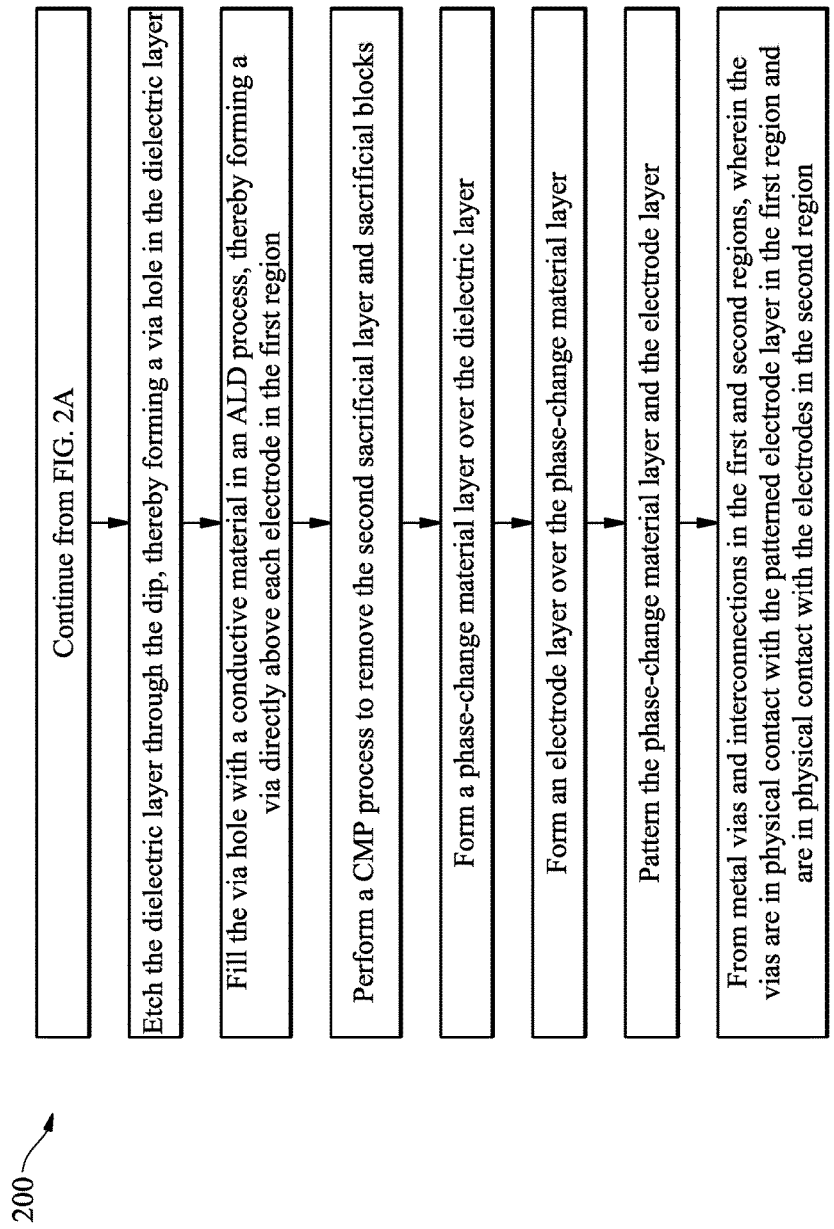

FIGS. 2A and 2B illustrate a flow chart of a method 200 for forming semiconductor devices according to the present disclosure. The method 200 is an example, and is not intended to limit the present disclosure beyond what is explicitly recited in the claims. Additional operations can be provided before, during, and after the method 200, and some operations described can be replaced, eliminated, or relocated for additional embodiments of the method. The method 200 is described below in conjunction with FIGS. 3-15, which illustrate cross-sectional views of a semiconductor device 300 during various fabrication steps according to an embodiment of the method 200. The semiconductor device 300 may be substantially similar to the semiconductor device 100 of FIG. 1 in many regards.

The semiconductor device 300 may be an intermediate device fabricated during processing of an integrated circuit (IC), or a portion thereof, that may comprise static random access memory (SRAM) and/or logic circuits, passive components such as resistors, capacitors, and inductors, and active components such as p-type FETs (pFETs), n-type FETs (nFETs), FinFETs, metal-oxide semiconductor field effect transistors (MOSFET), and complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

Figure 3:
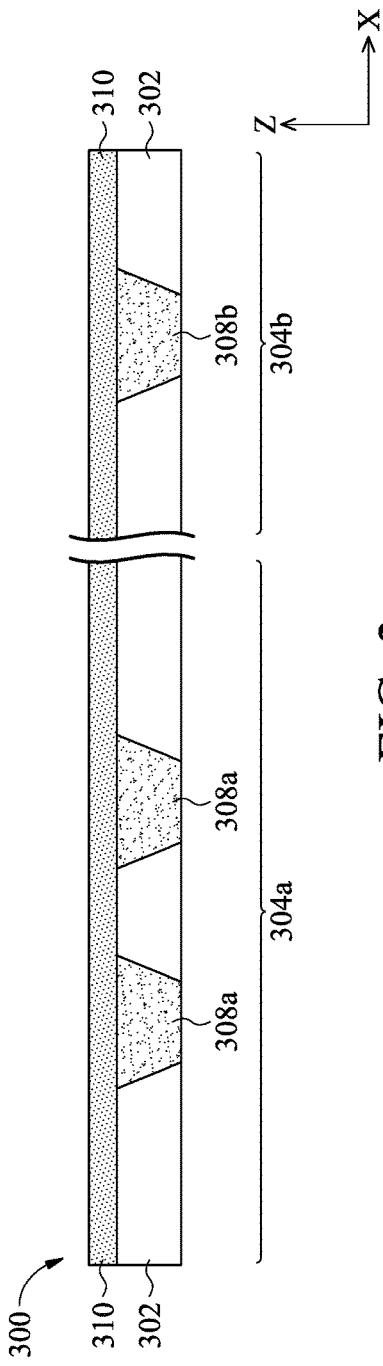

At operation 202, the method 200 (FIG. 2A) provides a precursor of the semiconductor device 300 (FIG. 3). For the convenience of discussion, the precursor of the semiconductor device 300 is also referred to as the device 300. The device 300 may include a substrate 302 and various features formed therein or thereon. The substrate 302 is a silicon substrate in the illustrated embodiment. Alternatively, substrate 302 may comprise another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 302 is a semiconductor on insulator (SOI).

The substrate 302 includes a first region 304a and a second region 304b. The first region 304a may be referred to as a PCRAM region 304a, in which PCRAM cells are to be formed, and the second region 304b may be referred to as a peripheral region 304b, in which control circuit of the PCRAM cells or other logic circuits are to be formed. The substrate 302 also includes one or more electrodes (or bottom electrodes) 308a and 308b in regions 304a and 304b, respectively. Throughout the description, the electrodes 308a and 308b are also referred to as conductive columns 308a and 308b. In some embodiments, the conductive columns 308a and 308b are contact plugs for accessing source/drain regions and/or gate electrodes of transistors (not shown) formed in lower layers of the substrate 302. The substrate 302 may further include an ILD layer, which surrounds the conductive columns 308a and 308b. The formation processes of the conductive columns 308a and 308b may include a single or dual damascene process, during which the ILD layer is formed, followed by forming openings, and filling metallic materials into the openings. A chemical mechanical polish (CMP) process is then performed to remove excess metallic materials, leaving the conductive columns 308a and 308b. The conductive columns 308a and 308b may be formed of Al, Cu, AlCu, W, or other metallic materials. In yet another embodiment, the conductive columns 108a and 108b are formed of polysilicon. Due to process reasons, each of the conductive columns 308a and 308b may have a tapered profile, with upper portions wider than the respective lower portions.

Still referring to FIG. 3, at operation 204, the method 200 (FIG. 2A) forms a dielectric layer 310 over the substrate 302. In subsequent operations, the dielectric layer 310 serves as a CMP stop layer for other material layers formed thereon. Therefore, the dielectric layer 310 may also be referred to as a CMP stop layer 310. The dielectric layer 310 may include a dielectric material such as SiC, Si3N4, silicon oxynitride (SiON), and/or silicon oxide. In the illustrated embodiment, the dielectric layer 310 includes SiC. The dielectric layer 310 may be formed to any suitable thickness and by any suitable process including chemical vapor deposition (CVD), low pressure CVD (LPCVD), high-density plasma CVD (HDP-CVD), physical vapor deposition (PVD), atomic-layer deposition (ALD), and/or other suitable deposition processes. In the illustrated embodiment, the dielectric layer 310 has a thickness of about 20 nm to about 100 nm, such as about 50 nm.

Figure 4:
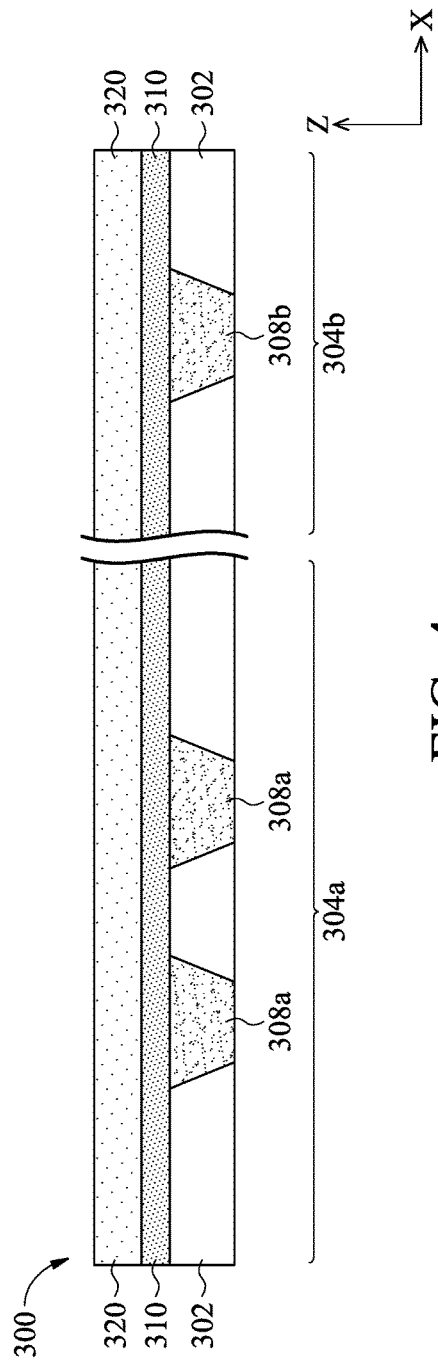

At operation 206, the method 200 (FIG. 2A) forms a first sacrificial layer 320 over the dielectric layer 310 (FIG. 4). The first sacrificial layer 320 may include a dielectric material such as Si3N4, tetraethyl orthosilicate (TEOS) oxide, silicon oxide, SiON, silicon carbonitride (SiCN), silicon carbon oxynitride (SiCON), other dielectric materials, or combination thereof. The composition of the first sacrificial layer 320 is selected such that the first sacrificial layer 320 has some etch selectivity with respect to the dielectric layer 310. In some embodiments, the first sacrificial layer 320 includes silicon nitride. The first sacrificial layer 320 may be formed to any suitable thickness and by any suitable process including CVD, LPCVD, HDP-CVD, PVD, ALD, and/or other suitable deposition processes. In the illustrated embodiment, the first sacrificial layer 320 has a thickness of about 20 nm to about 80 nm, such as about 50 nm.

Figure 5A:
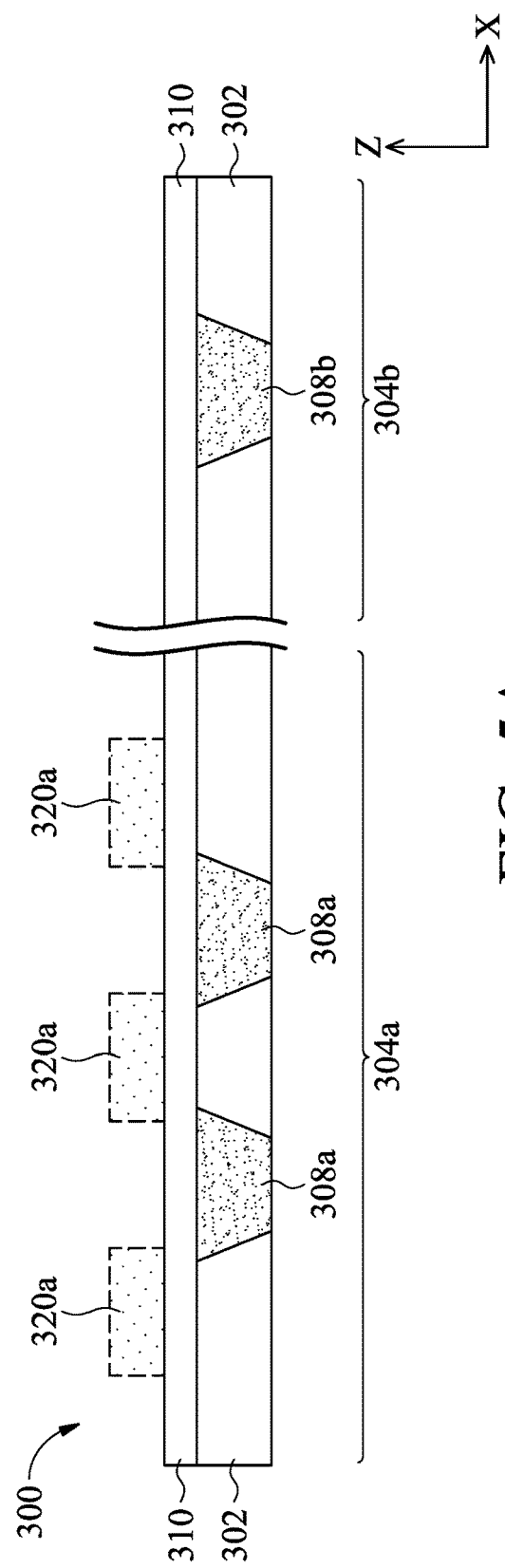
Figure 5B:
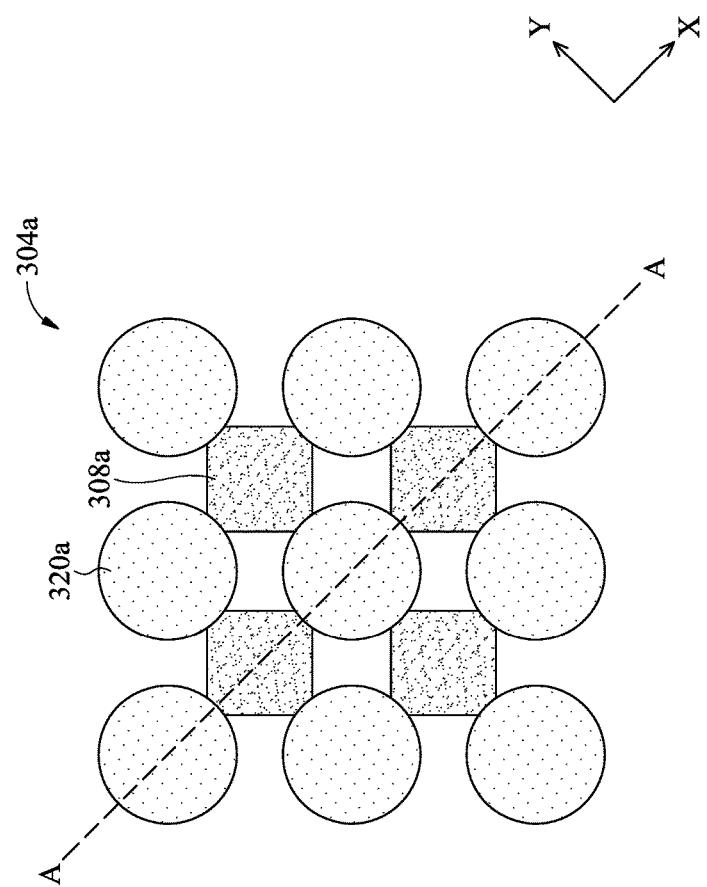

At operation 208, the method 200 (FIG. 2A) patterns the first sacrificial layer 320 to form multiple sacrificial blocks 320a surrounding conductive columns 308a from a top view of the PCRAM region 304a (FIGS. 5A and 5B). FIG. 5A is a cross-sectional view of the device 300 along A-A line of FIG. 5B, which illustrates a top view of the PCRAM region 304a of the device 300. To pattern the first sacrificial layer 320, operation 208 may include a variety of processes such as photolithography and etching. The photolithography process may include forming a photoresist (not shown) over the first sacrificial layer 320. An exemplary photoresist includes a photosensitive material sensitive to radiation such as UV light, deep ultraviolet (DUV) radiation, and/or EUV radiation. A lithographic exposure is performed on the device 300 that exposes selected regions of the photoresist to radiation. The exposure causes a chemical reaction to occur in the exposed regions of the photoresist. After exposure, a developer is applied to the photoresist. The developer dissolves or otherwise removes either the exposed regions in the case of a positive resist development process or the unexposed regions in the case of a negative resist development process. Suitable positive developers include TMAH (tetramethyl ammonium hydroxide), KOH, and NaOH, and suitable negative developers include solvents such as n-butyl acetate, ethanol, hexane, benzene, and toluene. After the photoresist is developed, the exposed portions of the first sacrificial layer 320 may be removed by an etching process, such as wet etching, dry etching, Reactive Ion Etching (RIE), ashing, and/or other suitable etching methods. By selecting an etchant that targets a material composition of the first sacrificial layer 320 while resist etching of the dielectric layer 310, the conductive columns 308a and 308b remain covered by the dielectric layer 310. In the illustrated embodiment, the first sacrificial layer 320 in the peripheral region 304b is removed, while portion of the first sacrificial layer 320 in the PCRAM region 304a remains, resulting in a patterned first sacrificial layer 320 that consists of a plurality of sacrificial blocks 320a. After etching, the photoresist may be removed.

Figure 5D:
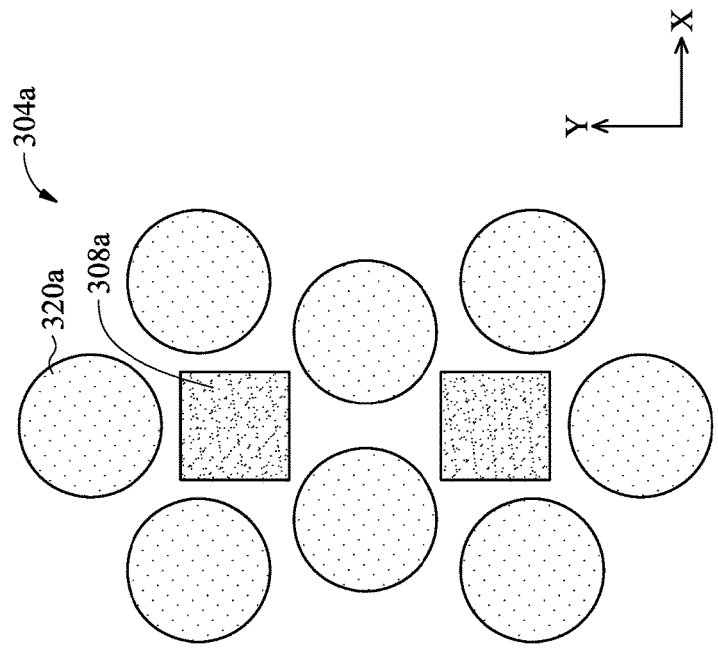
Figure 5C:
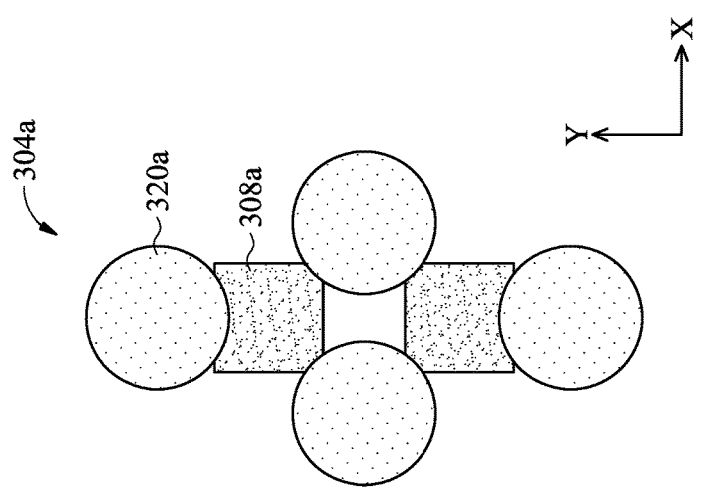

Still referring to FIGS. 5A and 5B, sacrificial blocks 320a are interleaved among neighboring conductive columns 308a in a pattern such that each conductive column 308a is surrounded (or encircled) by multiple sacrificial blocks 320a. The multiple sacrificial blocks 320a may be equidistant to the respective surrounded conductive column 308a. In the illustrated embodiment, each conductive column 308a is surrounded by four sacrificial blocks 320a. In another embodiment, each conductive column 308a is surrounded by three sacrificial blocks 320a, such as the illustration in FIG. 5C. In various embodiments, each conductive column 308a may be surrounded by any suitable number of sacrificial blocks 320a, such as five or more than five. As an example, FIG. 5D illustrates an embodiment in which each conductive column 308a is surrounded by five sacrificial blocks 320a.

In the illustrated embodiment, the sacrificial block 320a has a shape of a cylinder. In other embodiments, the sacrificial block 320a may have various shapes, such as a square or other polygonal shapes from a top view. In the illustrated embodiment, a sacrificial block 320a overlaps with its respective conductive column 308a from a top view. In some embodiments, the overlapping area may be less than 20% of the top surface area of the respective conductive column 308a. In furtherance of some embodiments, the overlapping area may be around 5% of the top surface area of the respective conductive column 308a. In yet another embodiment, sidewalls of the sacrificial block 320a are offset from edges of the respective conductive column 308a, such that the sacrificial block 320a does not overlap with the respective conductive column 308a from a top view.

Figure 6:
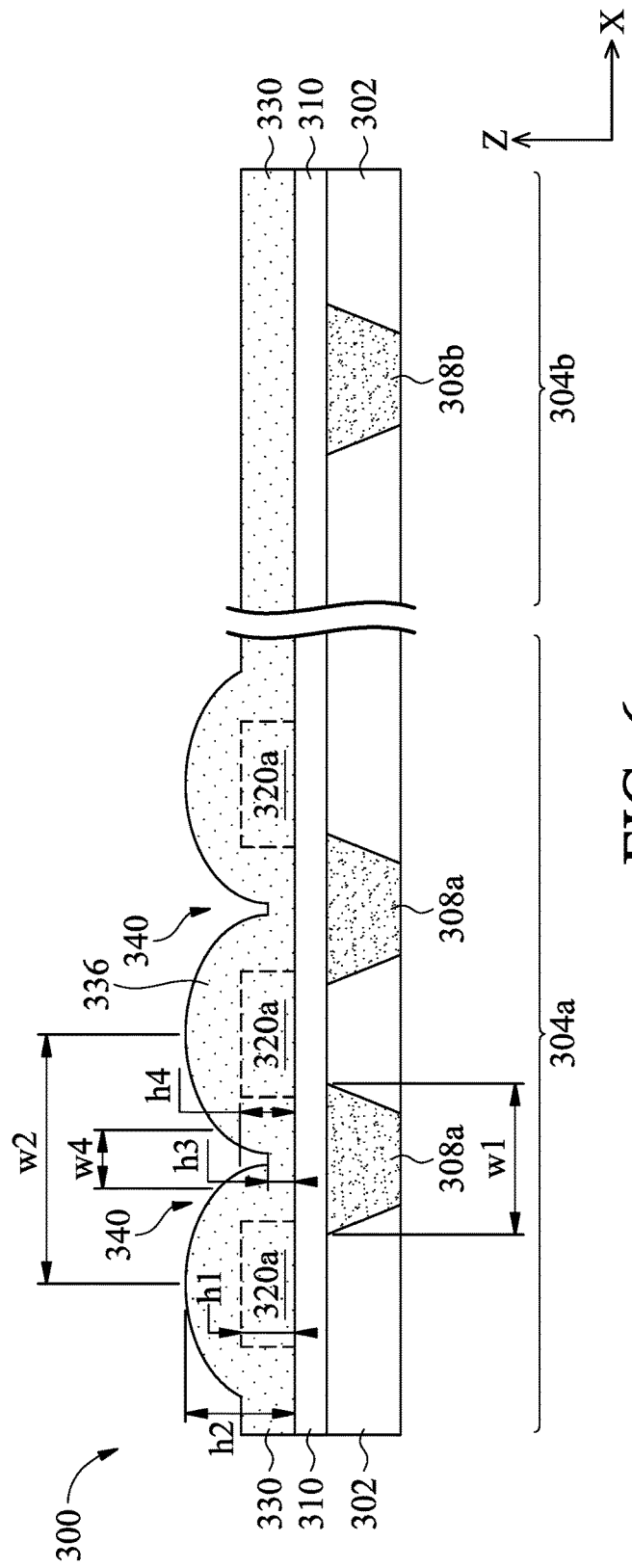

At operation 210, the method 200 (FIG. 2A) forms a second sacrificial layer 330 over the device 300, covering the PCRAM region 304a and the peripheral region 304b (FIG. 6). In the illustrated embodiment, the second sacrificial layer 330 is deposited as a blanket layer over top and sidewalls of the sacrificial blocks 320a and over exposed top surface of the dielectric layer 310. Suitable dielectric materials for the second sacrificial layer 330 include $Si_3N_4$, TEOS oxide, silicon oxide, SiON, SiCN, SiCON, other dielectric materials, or combination thereof. The dielectric material may be deposited by any suitable technique including CVD, LPCVD, HDP-CVD, PVD, or ALD. In many regards, the second sacrificial layer 330 may be substantially similar to the first sacrificial layer 320, and a similar deposition process may be performed on the device 300 to deposit the second sacrificial layer 330. In the illustrated embodiment, the second sacrificial layer 330 includes the same material composition as the first sacrificial layer 320 (e.g., $Si_3N_4$), such that there is no boundary between the second sacrificial layer 330 and the sacrificial blocks 320a in areas that they are in contact with each other. In yet another embodiment, the second sacrificial layer 330 and the first sacrificial layer 320 include different material compositions. As an example, the first sacrificial layer 320 may include $Si_3N_4$ and the second sacrificial layer 330 may include TEOS, or the first sacrificial layer 320 may include TEOS oxide and the second sacrificial layer 330 may include $Si_3N_4$.

Still referring to FIG. 6, the second sacrificial layer 320 forms dielectric bumps 336 at locations of the sacrificial blocks 320a during the deposition of the dielectric material as a blanket layer. In some embodiments, a dielectric bump 336 has a curved sidewall. The adjacent dielectric bumps 336, which are defined by the sacrificial blocks 320a surrounding a respective conductive column 308a, connect with each other at the bottom and form a dip 340 between the respective sidewalls thereof. The dip 340 has a tapering profile with the narrowest portion at the bottom and the widest opening at the top. In some embodiments, the bottom of the dip 340 is lower than a top surface of the second sacrificial layer 330 in the peripheral region 304b. In various embodiments, the dip 340 is directly above the conductive column 308a. In one example, the dip 340 is directly above the center of the conductive column 308a. For simplicity, the thickness of the sacrificial block 320a is denoted as h1; the thickness of the second sacrificial layer 330 at the top of the dielectric bump 336 is denoted as h2; the thickness of the second sacrificial layer 330 at the bottom of the dip 340 is denoted as h3; the width of the top surface of the conductive column 308a is denoted as w1; the distance between the top of two adjacent dielectric bumps 336 is denoted as w2; and the opening width of the dip 340 measured at sidewalls where the thickness of the second sacrificial layer 330 (h4) is half of h2 (h4=h2/2) is denoted as w4. In some embodiments, the ratio of h3/h1 is from about 0.2 to about 1.0, the ratio of h2/h1 is from about 1.5 to about 3.0, the ratio of w4/w1 is from about 0.1 to about 0.4, and the ratio of w4/w2 is from about 0.05 to about 0.4. In one specific example, the ratio of h3/h1 is about 0.5, the ratio of h2/h1 is about 2, the ratio of w4/w1 is about 0.3, and the ratio of w4/w2 is about 0.2.

Figure 7:
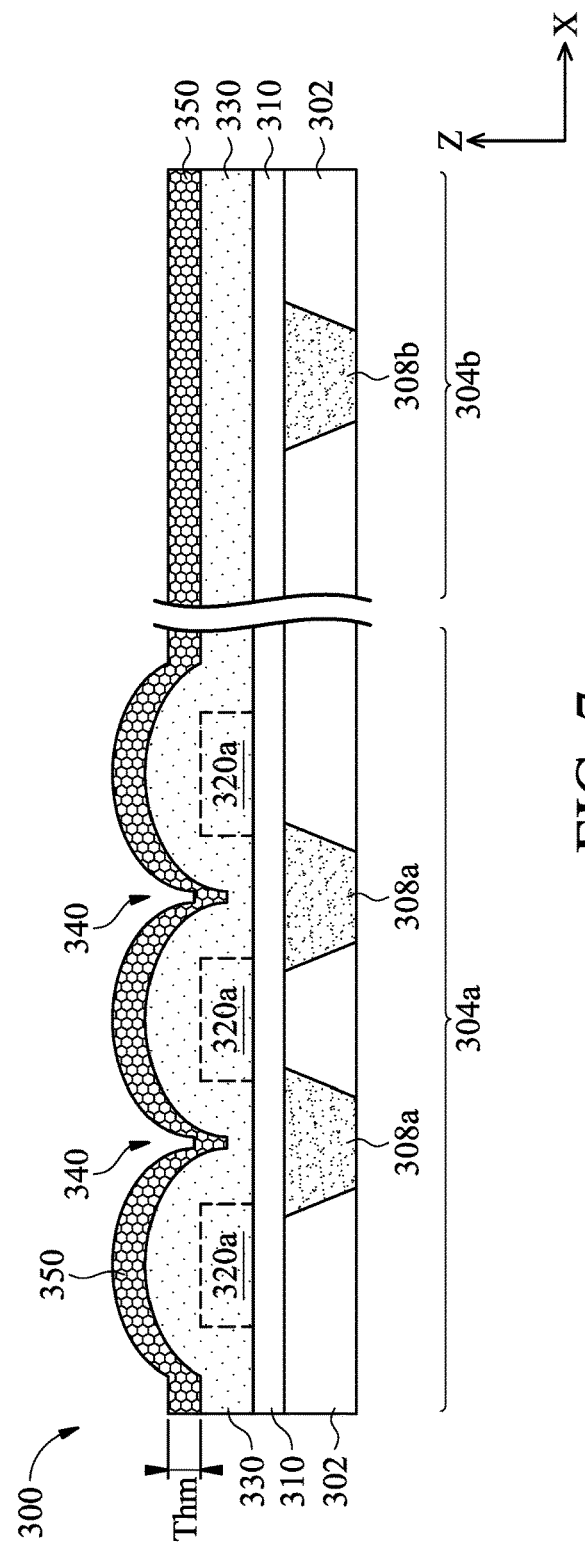

At operation 212, the method 200 (FIG. 2A) forms a hard mask layer 350 over the device 300, covering the PCRAM region 304a and the peripheral region 304b (FIG. 7). In the illustrated embodiment, the hard mask layer 350 is deposited as a blanket layer over the dielectric bumps 336 and over the bottom and sidewalls of the dips 340. The hard mask layer 350 may include TiN, TaN, W, $Si_3N_4$, SiC, silicon oxide, SiON, SiCN, SiCON, other suitable materials, or a combination thereof. The composition of the hard mask layer 350 is selected such that the hard mask layer 350 has some etch selectivity with respect to the second sacrificial layer 330. In the illustrated embodiment, the hard mask layer 350 includes TiN. In some embodiments, the hard mask layer 350 is deposited by a CVD process. Due to the gap fill capability of a CVD process, the depositing materials may be easier to accumulate at upper portions of the dip 340 than at its bottom. Further, the tapering profile of the sidewalls of the dip 340 prevents the upper opening of the dip 340 to be closed by the CVD process before its bottom is covered. The parameters in the CVD process (e.g., pressure, temperature, and gas viscosity) may be tuned in a way such that the gap fill behavior of depositing materials maintains the dip 340 with a thinner hard mask layer 350 at bottom than on sidewalls. In some embodiments, the CVD process employs a setting with pressure less than about 0.8 torr and temperature higher than about 80 degrees Celsius. Hence, the material of the hard mask layer 350 may be deposited without closing the opening of the dip 340, leaving a deposited layer thinner at the bottom of the dip 340 than on its sidewalls. At various positions over the dielectric bumps 336 and over the bottom and sidewalls of the dips 340, the hard mask layer 350 has different thicknesses. While over planar surface portions of the second sacrificial layer 330, the hard mask layer 350 has a substantially constant thickness in both the PCRAM region 304a and the peripheral region 304b, which is denoted as $T_{hm}$, as shown in FIG. 7. The hard mask layer 350 may have the thickness $T_{hm}$ ranging from about 20 nm to about 100 nm, such as 60 nm.

Figure 8:
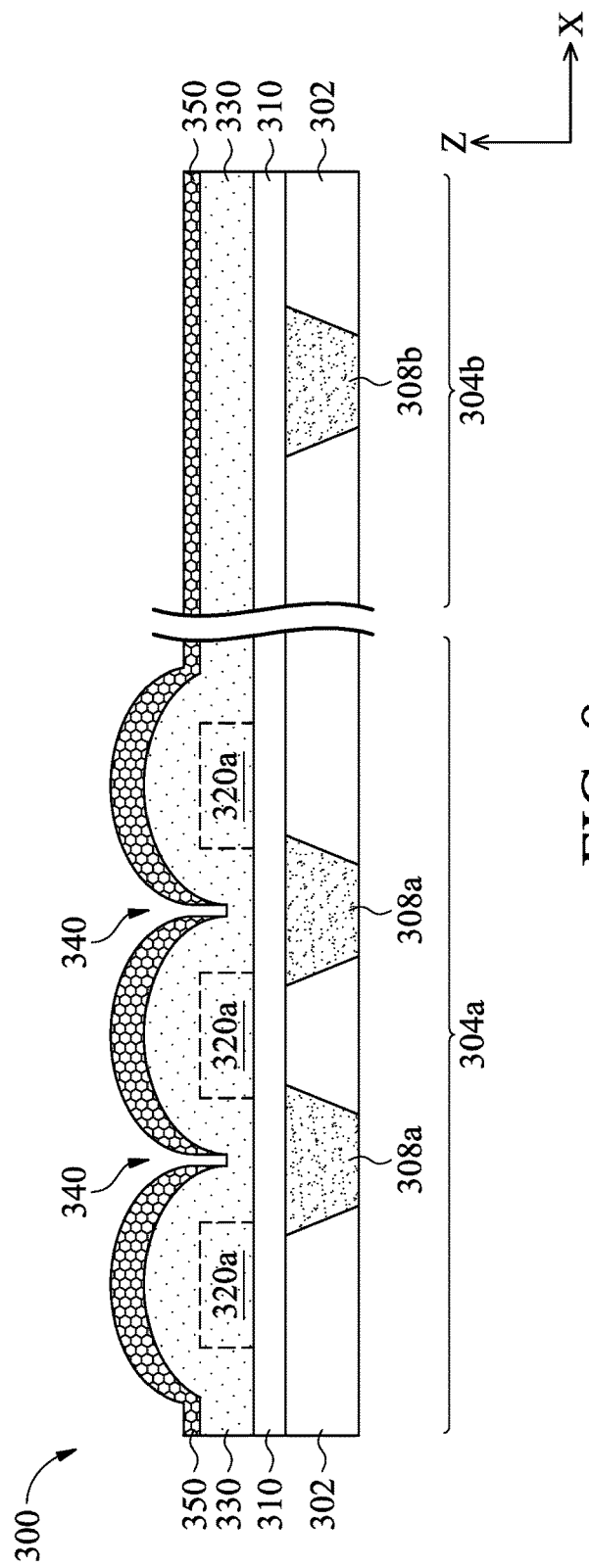

At operation 214, the method 200 (FIG. 2A) etches the hard mask layer 350 to expose the bottom of the dip 340 (FIG. 8). Since the portion of the hard mask layer 350 at the bottom of the dip 340 is thinner than elsewhere, the bottom portion is etched away earlier than other portions, resulting in the second sacrificial layer 330 being exposed at the bottom of the dip 340 while other portions of the second sacrificial layer 330 is still covered by the hard mask layer 350. The etching process may include any suitable etching technique such as wet etching, dry etching, RIE, ashing, and/or other etching methods. The etchant is selected to resist etching the second sacrificial layer 330. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. In the illustrated embodiment, operation 212 includes a wet etching process controlled by timing to thin down the hard mask layer 350 and to open up only the bottom of the dip 340.

Figure 9:
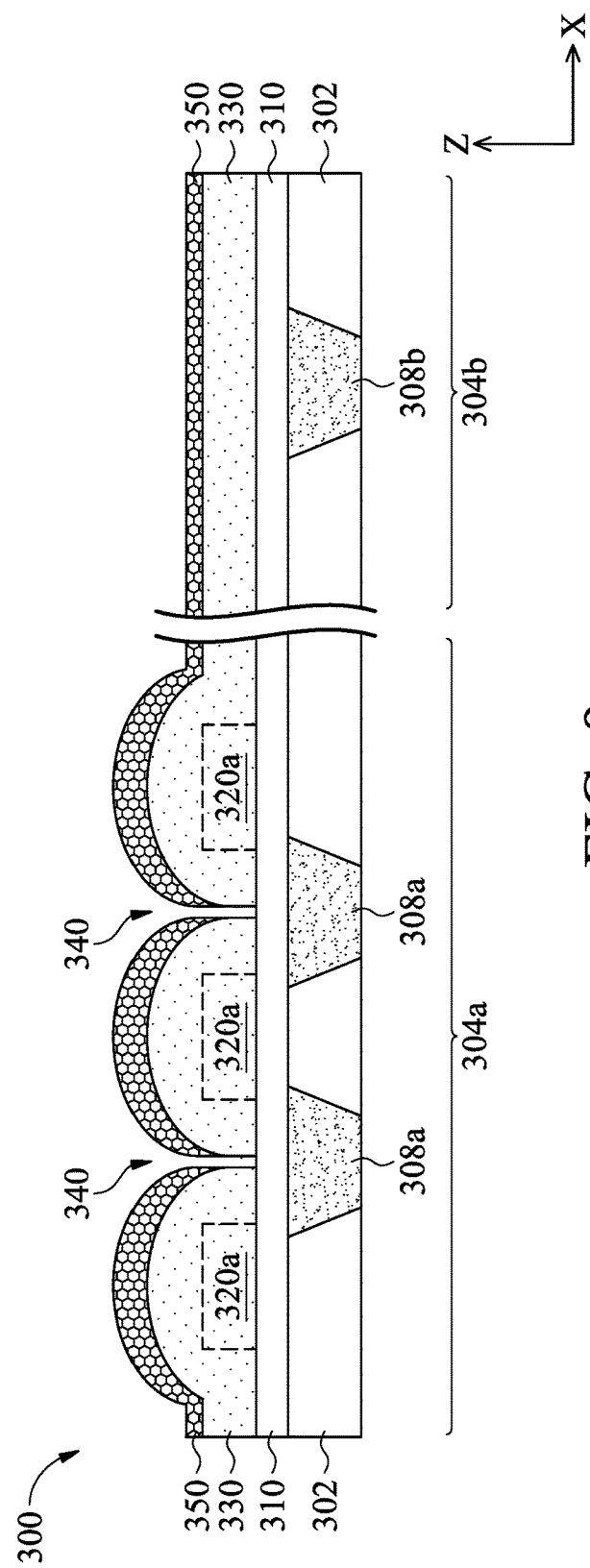

At operation 216, the method 200 (FIG. 2A) etches the second sacrificial layer 330 using the hard mask layer 350 as an etching mask (FIG. 9). The dip 340 is extended downwardly during the etching process and exposes the dielectric layer 310 at the bottom of the dip 340. The etching process may include any suitable etching technique such as wet etching, dry etching, RIE, ashing, and/or other etching methods. By selecting an etchant that targets a material composition of the second sacrificial layer 330 while resist etching of the hard mask layer 350 and the dielectric layer 310, the hard mask layer 350 on sidewalls of the dip 340 and the dielectric layer 310 at bottom of the dip 340 substantially remain. The conductive columns 308a and 308b remain covered by the dielectric layer 310.

Figure 10:
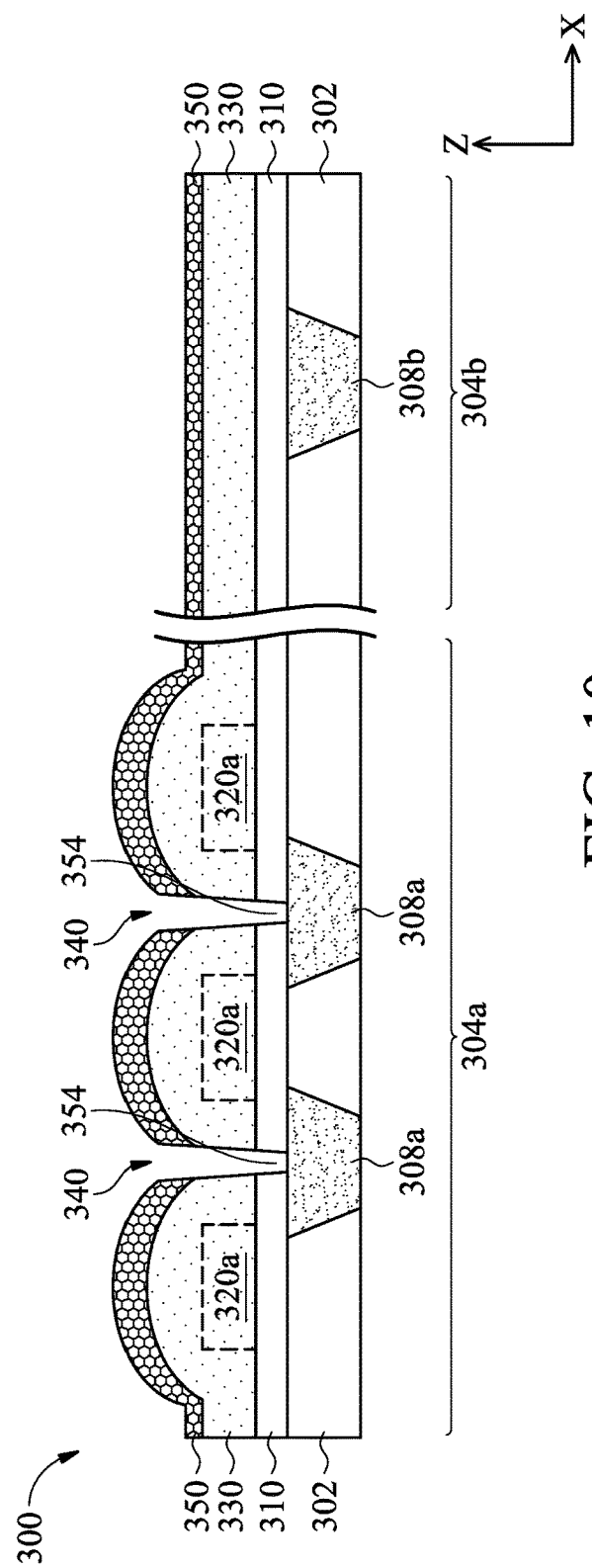

At operation 218, the method 200 (FIG. 2B) etches the dielectric layer 310 using the second sacrificial layer 330 as an etching mask (FIG. 10). The dip 340 is further extended downwardly during the etching process and exposes the conductive column 308a at the bottom of the dip 340. The conductive column 308a also serves as an etching stop layer during operation 218. The removing of the dielectric layer 310 from the bottom of the dip 340 may include any suitable etching technique such as wet etching, dry etching, RIE, ashing, and/or other etching processes. In some embodiments, an etchant is selected such that the dielectric layer 310 and the second sacrificial layer 330 have a high etch selectivity. For example, the etch selectivity between the dielectric layer 310 and the second sacrificial layer 330 has a ratio about 5:1 or larger, such as from 5:1 to 20:1. The bottom portion of the dips 340 surrounded by the dielectric layer 310 forms via holes 354 directly above the conductive columns 308a. The via holes 354 are to be filled up with conductive materials in subsequent processes to form heating elements in PCRAM cells. According to the description above, the forming of the via hole 354 is mainly a self-aligned process without using photolithographic patterning (except the formation of the sacrificial blocks 320a) and relatively low via hole width-to-height ratio can be achieved. In some embodiments, the via hole 354 has a width-to-height ratio less than 1.0. In furtherance of some embodiments, the via hole 354 has a width-to-height ratio ranging from about 0.2 to about 1.0. In one specific example, the via hole 354 has a width-to-height ratio about 0.4. In yet another embodiment, the via hole 354 has a width-to-height ratio ranging from about 0.1 to about 0.2.

Figure 11:
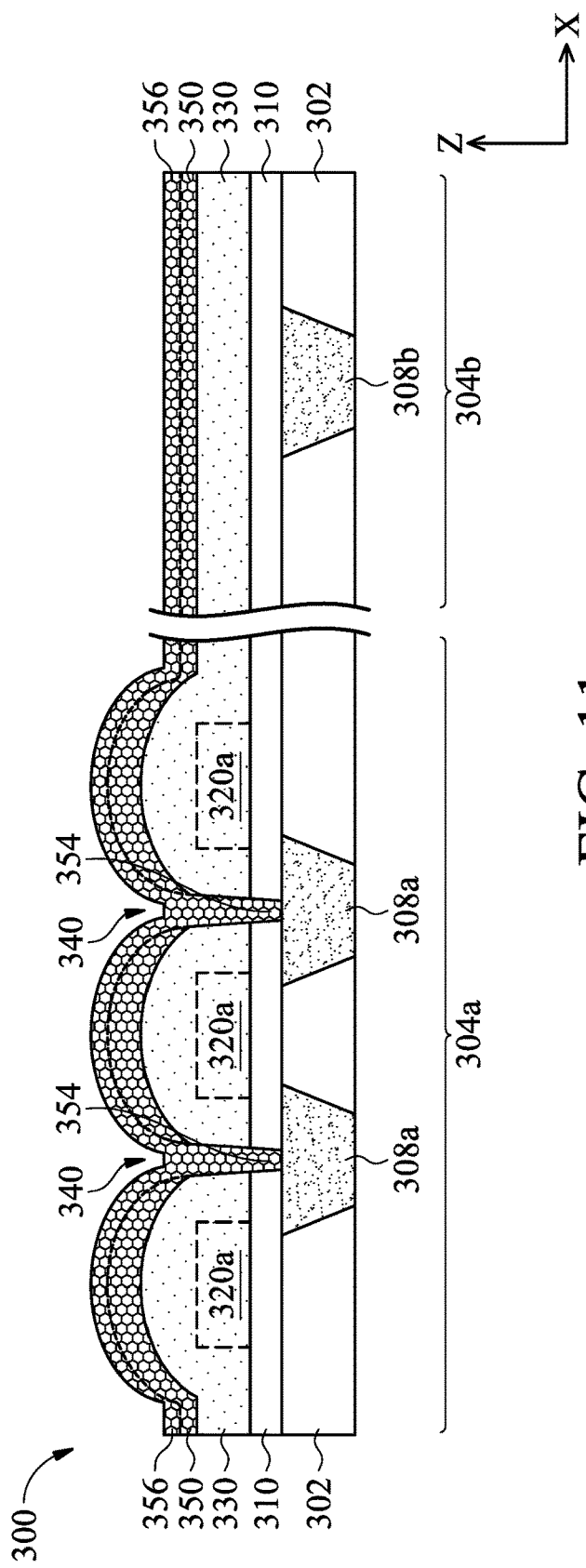

At operation 220, the method 200 (FIG. 2B) fill the via hole 354 with a conductive material (FIG. 11). The filling of the via hole 354 may include depositing a conductive material layer 356 over the device 300, covering the PCRAM region 304a and the peripheral region 304b. Suitable conductive materials for the layer 356 include TiN, TaN, W, other suitable conductive materials, or combination thereof. The conductive material layer 356 may be deposited by any suitable technique including plating, CVD, LPCVD, HDP-CVD, PVD, or ALD. In the illustrated embodiment, the conductive material layer 356 is deposited by an ALD process, taking advantage of the strong gap filling capability of an ALD process to fill in the bottom of the dips 340 with a high aspect ratio. In some embodiments, the conductive material layer 356 and the hard mask layer 350 include different material compositions. As an example, the conductive material layer 356 may include TiN while the hard mask layer 350 may include SiC, or the conductive material layer 356 may include TaN while the hard mask layer 350 may include TiN. In the illustrated embodiment, the conductive material layer 356 includes the same material composition as the hard mask layer 350, for example TiN, such that there is no boundary between the conductive material layer 356 and the hard mask layer 350 in areas that they are in contact. The conductive material layer 356 fills up the via hole 354 surrounded by the dielectric layer 310 and raises the bottom of the dip 340. In some embodiments, the raised bottom of the dip 340 is higher than a top surface of the sacrificial blocks 320a. In some embodiments, the raised bottom of the dip 340 is lower than a top surface of the sacrificial blocks 320a but higher than a bottom surface of the sacrificial blocks 320a.

At operation 222, the method 200 (FIG. 2B) performs one or more chemical mechanical planarization (CMP) processes to polish the device 300 and to expose the dielectric layer 310 (FIG. 12). The dielectric layer 310 serves as a CMP stop layer during the CMP processes. After the CMP processes, the material layers above the dielectric layer 310, such as the sacrificial blocks 320a, the second sacrificial layer 330, the hard mask layer 350, and the conductive material layer 356, are removed. After the CMP processes, the conductive material filled in the via hole 354 is exposed, which is also denoted as bottom via 360. In some embodiments, the bottom via 360 has a width-to-height ratio less than 1.0. In furtherance of some embodiments, the bottom via 360 has a width-to-height ratio ranging from about 0.2 to about 1.0. In one specific example, the bottom via 360 has a width-to-height ratio of about 0.4. In yet another embodiment, the bottom via 360 has a width-to-height ratio ranging from about 0.1 to about 0.2. The height of the bottom via 360 may be within a range from about 20 nm to about 100 nm, such as about 50 nm.

At operation 224, the method 200 (FIG. 2B) forms a phase-change material layer 370 over the device 300 (FIG. 13). The phase-change material layer 370 is in physical contact with the bottom via 360. The phase-change material layer 370 includes phase-change materials, such as chalcogenide materials and/or stoichiometric materials. In some embodiments, the phase-change material layer 370 includes germanium (Ge), Tellurium (Te), or Antimony (Sb). In one specific example, the phase-change material layer 370 includes GeSbTe alloy, AgInSbTe alloy, or hafnium oxide compound. The phase-change material layer 370 may be deposited by any suitable technique including CVD, LPCVD, HDP-CVD, PVD, or ALD.

At operation 226, the method 200 (FIG. 2B) forms an electrode layer 374 over the phase-change material layer 370 (FIG. 13). In some embodiments, the electrode layer 374 is formed of TiN, TaN, W, and/or other suitable materials. The electrode layer 374 may be deposited by any suitable technique including plating, CVD, LPCVD, HDP-CVD, PVD, or ALD.

Figure 14:
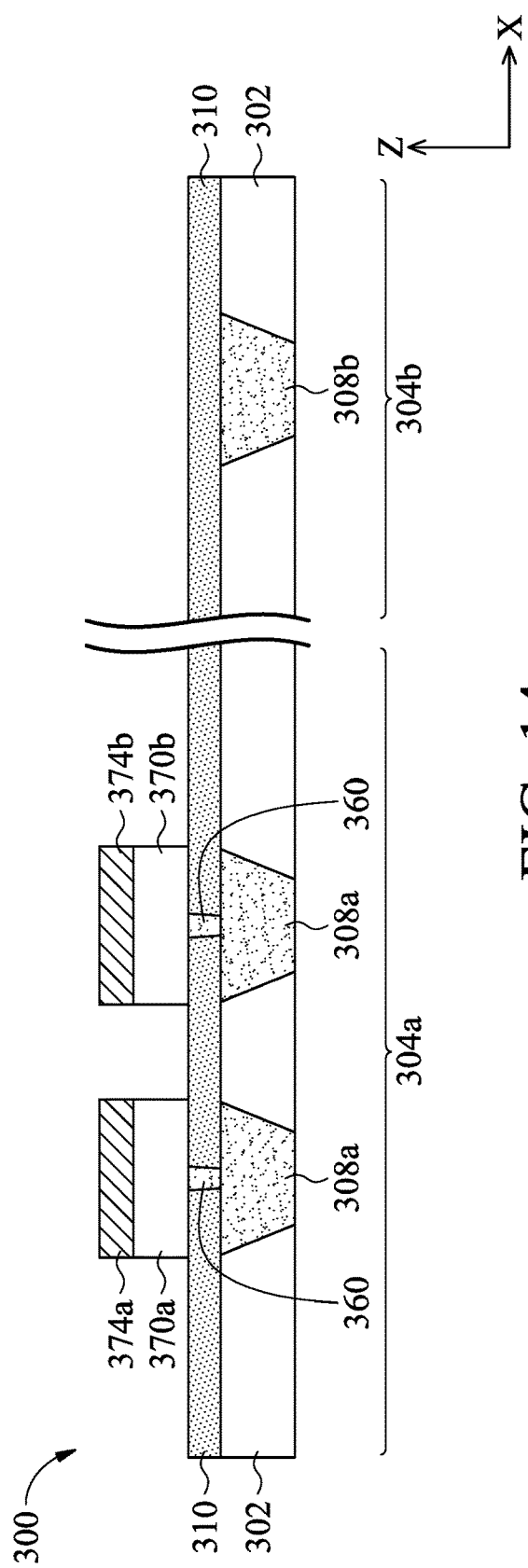

At operation 228, the method 200 (FIG. 2B) patterns the phase-change material layer 370 and the electrode layer 374 to form phase-change strips 370a and top electrodes 374a stacked above respective bottom vias 360 and conductive columns 308a (FIG. 14). To pattern the phase-change material layer 370 and the electrode layer 374 may include a variety of processes such as photolithography and etching. The photolithography process may include forming a photoresist over the electrode layer 374, exposing the resist to a pattern that defines an opening, performing post-exposure bake processes, and developing the resist to form a masking element. The masking element, or a derivative thereof, is then used for etching the phase-change material layer 370 and the electrode layer 374. The masking element (e.g., a patterned resist) is subsequently removed. The etching processes may include multiple etching steps with different etching chemistries, each targeting a particular material in the electrode layer 374 and the phase-change material layer 370. The etching processes may include one or more dry etching processes, wet etching processes, and other suitable etching techniques. The etching processes remove the phase-change material layer 370 and the electrode layer 374 from the peripheral region 304b.

Figure 15:
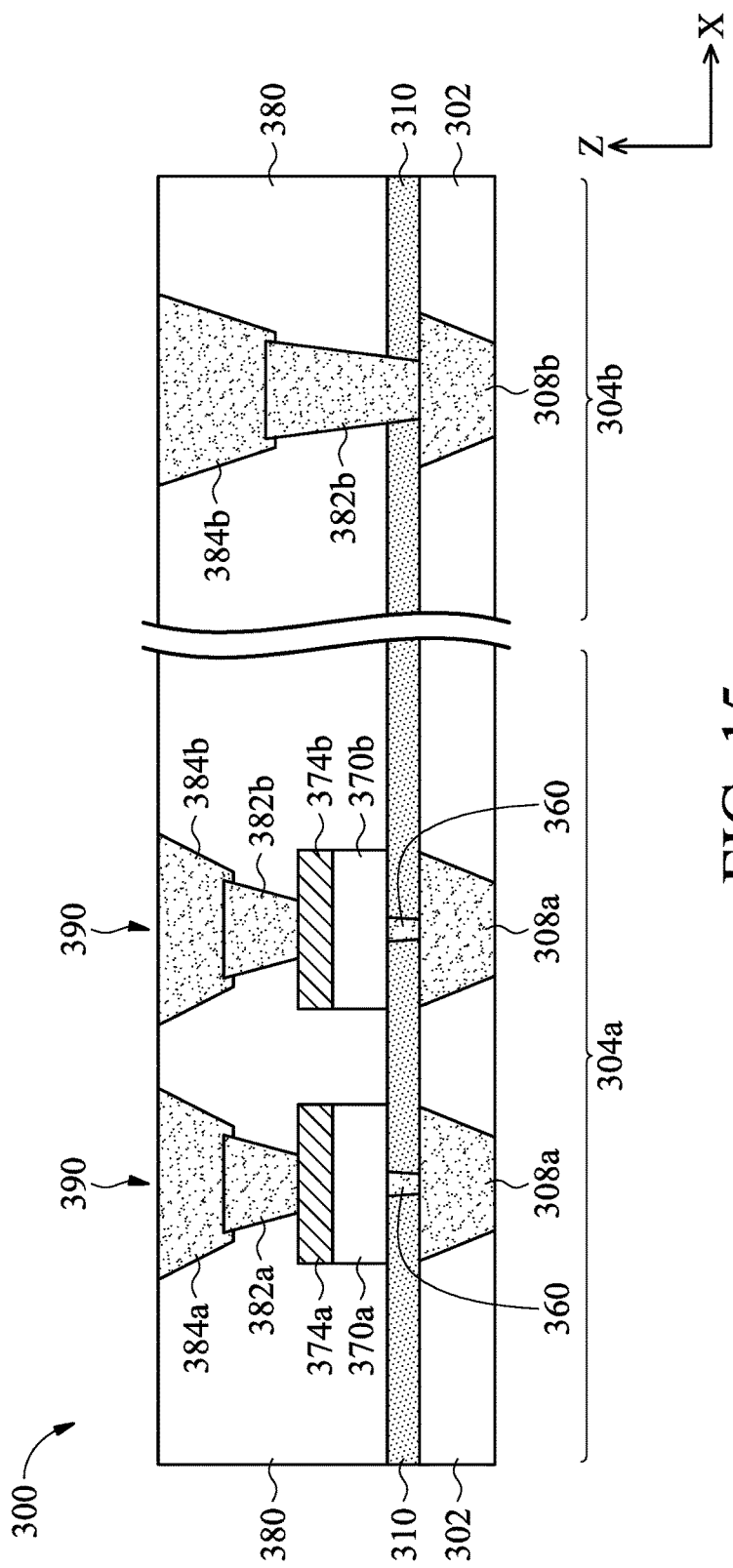

At operation 230, the method 200 (FIG. 2B) proceeds to further processes in order to complete the fabrication of the PCRAM cells 390. For example, as illustrated in FIG. 15, the method 200 may form a second dielectric layer 380 over the device 300. The second dielectric layer 380 may be an ILD layer or an IMD layer. In some embodiments, the dielectric layers 310 and 380 include the same material (e.g., $Si_3N_4$), such that there is no boundary between the dielectric layers 310 and 380 in areas that they are in contact. In some embodiments, the dielectric layers 310 and 380 include different material compositions. For example, the dielectric layer 310 includes SiC and the dielectric layer 380 includes materials other than SiC, such as silicon oxide, borophosphosilicate glass (BPSG), tetraethylorthosilicate (TEOS) oxide, un-doped silicate glass, fused silica glass (FSG), phosphosilicate glass (PSG), boron doped silicon glass (BSG), low-k dielectric material, and/or other suitable dielectric materials. The second dielectric layer 380 may be deposited by a PECVD process, a flowable CVD (FCVD) process, or other suitable deposition technique. The method 200 may also form vias 382a and metal lines 384a in the PCRAM region 304a, which electrically connect to the top electrodes 374a for metal interconnections. The vias 382a and metal lines 384a may be formed of Al, Cu, AlCu, W, and/or other suitable conductive materials. The formation of the vias 382a and metals lines 384a may include dual damascene process. Similarly, in peripheral region 304b, vias 382b and metal lines 384b are formed and electrically connect to the conductive column 308b through the dielectric layer 310.

Although not intended to be limiting, one or more embodiments of the present disclosure provide many benefits to a semiconductor device and the formation thereof, including phase-change memory cells. For example, vias with very low width-to-height ratio may be formed to function as heating elements with high heating efficiencies, which boosts writing speed of the phase-change memory cells. Further, the disclosed methods of forming via structures are not limited to the forming of phase-change memory cells and can be easily integrated into other existing semiconductor manufacturing processes where via structures are to be formed.

In one exemplary aspect, the present disclosure is directed to a method. The method includes providing a substrate having a conductive column, a dielectric layer over the conductive column, and a plurality of sacrificial blocks over the dielectric layer, the plurality of sacrificial blocks surrounding the conductive column from a top view; depositing a sacrificial layer covering the plurality of sacrificial blocks, the sacrificial layer having a dip directly above the conductive column; depositing a hard mask layer over the sacrificial layer; removing a portion of the hard mask layer from a bottom of the dip; etching the bottom of the dip using the hard mask layer as an etching mask, thereby exposing a top surface of the conductive column; and forming a conductive material inside the dip, the conductive material being in physical contact with the top surface of the conductive column. In an embodiment, each of the plurality of sacrificial blocks has a cylinder shape. In an embodiment, the sacrificial layer includes the same material composition as the plurality of sacrificial blocks. In an embodiment, the sacrificial layer and the plurality of sacrificial blocks include different material compositions. In an embodiment, the plurality of sacrificial blocks consists of four sacrificial blocks. In an embodiment, the depositing of the hard mask layer includes performing a chemical vapor deposition (CVD) process. In an embodiment, the removing of the portion of the hard mask layer includes performing a wet etching process. In an embodiment, the forming of the conductive material inside the dip includes performing an atomic layer deposition (ALD) process. In an embodiment, the conductive material inside the dip includes titanium nitride. In an embodiment, the hard mask layer includes the same material composition as the conductive material inside the dip. In an embodiment, the method further includes performing a chemical-mechanical planarization (CMP) process to expose a top surface of the dielectric layer after the forming of the conductive material inside the dip. In an embodiment, the conductive material inside the dip has a width-to-height ratio less than 1.0, after the performing of the CMP process.

In another exemplary aspect, the present disclosure is directed to a method of forming a semiconductor device. The method includes providing a semiconductor substrate having a bottom electrode; forming a chemical-mechanical planarization (CMP) stop layer above the semiconductor substrate; forming a first sacrificial layer above the CMP stop layer; patterning the first sacrificial layer to form multiple sacrificial blocks around the bottom electrode from a top view; depositing a second sacrificial layer over the multiple sacrificial blocks, wherein the second sacrificial layer has a dip directly above the bottom electrode; removing a portion of the second sacrificial layer from a bottom of the dip, thereby exposing the CMP stop layer at the bottom of the dip; etching the CMP stop layer through the bottom of the dip, thereby forming a via hole in the CMP stop layer; and filling the via hole with a conductive material, wherein the conductive material is in physical contact with the bottom electrode. In an embodiment, the removing of the portion of the second sacrificial layer from the bottom of the dip includes forming a hard mask layer over the second sacrificial layer; removing a portion of the hard mask layer above the bottom of the dip to expose the portion of the second sacrificial layer; and etching the second sacrificial layer using the hard mask layer as an etching mask. In an embodiment, the forming of the hard mask layer includes depositing the hard mask layer with a smaller thickness at the bottom of the dip than on sidewalls of the dip. In an embodiment, after the filling of the via hole with the conductive material, then method further includes performing a CMP process to remove the second sacrificial layer and the multiple sacrificial blocks; forming a phase-change material layer over the CMP stop layer, wherein the phase-change material layer is in physical contact with the conductive material; and forming a top electrode above the phase-change material layer. In an embodiment, the phase-change material layer includes GeSbTe, AgInSbTe, or hafnium oxide.

In yet another exemplary aspect, the present disclosure is directed to a semiconductor device. The semiconductor device includes a substrate; a bottom electrode in the substrate; a dielectric layer above the bottom electrode; a conductive via through the dielectric layer, the conductive via being in physical contact with the bottom electrode and having a width-to-height ratio less than 1.0; a chalcogenide glass layer above the conductive via; and a top electrode above the chalcogenide glass layer. In an embodiment, the width-to-height ratio of the conductive via is within a range from about 0.2 to about 1.0. In an embodiment, the dielectric layer includes silicon carbide and the conductive via includes titanium nitride.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a substrate having a conductive column, a dielectric layer over the conductive column, and a plurality of sacrificial blocks over the dielectric layer, the plurality of sacrificial blocks surrounding the conductive column from a top view;
   depositing a sacrificial layer covering the plurality of sacrificial blocks, the sacrificial layer having a dip directly above the conductive column;
   depositing a hard mask layer over the sacrificial layer;
   removing a portion of the hard mask layer from a bottom of the dip;
   etching the bottom of the dip using the hard mask layer as an etching mask, thereby exposing a top surface of the conductive column; and
   forming a conductive material inside the dip, the conductive material being in physical contact with the top surface of the conductive column.

2. The method of claim 1, wherein each of the plurality of sacrificial blocks has a cylinder shape.

3. The method of claim 2, wherein the sacrificial layer includes the same material composition as the plurality of sacrificial blocks.

4. The method of claim 2, wherein the sacrificial layer and the plurality of sacrificial blocks include different material compositions.

5. The method of claim 1, wherein the plurality of sacrificial blocks consists of four sacrificial blocks.

6. The method of claim 1, wherein the depositing of the hard mask layer includes performing a chemical vapor deposition (CVD) process.

7. The method of claim 1, wherein the removing of the portion of the hard mask layer includes performing a wet etching process.

8. The method of claim 1, wherein the forming of the conductive material inside the dip includes performing an atomic layer deposition (ALD) process.

9. The method of claim 1, wherein the conductive material inside the dip includes titanium nitride.

10. The method of claim 1, wherein the hard mask layer includes the same material composition as the conductive material inside the dip.

11. The method of claim 1, further comprising:
    performing a chemical-mechanical planarization (CMP) process to expose a top surface of the dielectric layer after the forming of the conductive material inside the dip.

12. The method of claim 11, wherein the conductive material inside the dip has a width-to-height ratio less than 1.0, after the performing of the CMP process.

13. A method of forming a semiconductor device, comprising:
    providing a semiconductor substrate having a bottom electrode;
    forming a chemical-mechanical planarization (CMP) stop layer above the semiconductor substrate;
    forming a first sacrificial layer above the CMP stop layer;
    patterning the first sacrificial layer to form multiple sacrificial blocks around the bottom electrode from a top view;
    depositing a second sacrificial layer over the multiple sacrificial blocks, wherein the second sacrificial layer has a dip directly above the bottom electrode;
    removing a portion of the second sacrificial layer from a bottom of the dip, thereby exposing the CMP stop layer at the bottom of the dip;
    etching the CMP stop layer through the bottom of the dip, thereby forming a via hole in the CMP stop layer; and
    filling the via hole with a conductive material, wherein the conductive material is in physical contact with the bottom electrode.

14. The method of claim 13, wherein the removing of the portion of the second sacrificial layer from the bottom of the dip includes:
    forming a hard mask layer over the second sacrificial layer;
    removing a portion of the hard mask layer above the bottom of the dip to expose the portion of the second sacrificial layer; and
    etching the second sacrificial layer using the hard mask layer as an etching mask.

15. The method of claim 14, wherein the forming of the hard mask layer includes depositing the hard mask layer with a smaller thickness at the bottom of the dip than on sidewalls of the dip.

16. The method of claim 13, after the filling of the via hole with the conductive material, further comprising:
    performing a CMP process to remove the second sacrificial layer and the multiple sacrificial blocks;
    forming a phase-change material layer over the CMP stop layer, wherein the phase-change material layer is in physical contact with the conductive material; and
    forming a top electrode above the phase-change material layer.

17. The method of claim 16, wherein the phase-change material layer includes GeSbTe, AgInSbTe, or hafnium oxide.

18. A method, comprising:
    providing a substrate having an electrode embedded in the substrate;
    forming a plurality of dielectric blocks above the electrode, wherein the plurality of dielectric blocks surrounds the electrode from a top view;
    depositing a sacrificial layer covering top and sidewall surfaces of the plurality of dielectric blocks, wherein the sacrificial layer has a dip directly above the electrode;
    etching through a bottom of the dip to expose a top surface of the electrode; and
    depositing a conductive material in the dip, wherein the conductive material is in physical contact with the electrode.

19. The method of claim 18, wherein the forming of the plurality of dielectric blocks includes:
    forming a dielectric layer covering the substrate and the electrode; and
    patterning the dielectric layer to form the plurality of dielectric blocks.

20. The method of claim 18, further comprising:
performing a chemical-mechanical planarization (CMP) process to remove the plurality of dielectric blocks and the sacrificial layer.

* * * * *